United States Patent

Weimer et al.

[11] Patent Number: 6,067,026
[45] Date of Patent: May 23, 2000

[54] SENSOR APPARATUS

[75] Inventors: Georg Weimer, Kleinschwabhausen; Peter Sütsch, Erdweg, both of Germany

[73] Assignee: Telair International Electronic Systems GmbH, Karlsfeld, Germany

[21] Appl. No.: 09/134,693

[22] Filed: Aug. 14, 1998

[30] Foreign Application Priority Data

Aug. 20, 1997 [DE] Germany .......................... 197 36 258
Sep. 11, 1997 [DE] Germany .......................... 197 40 017

[51] Int. Cl.$^7$ ................................................. G08B 21/00
[52] U.S. Cl. .................................. 340/686.6; 340/686.1; 340/545.1; 340/545.2
[58] Field of Search ............................. 340/686.6, 686.1, 340/545.1, 545.2, 547, 549, 545.4, 545.7, 686.2, 425.5

[56] References Cited

U.S. PATENT DOCUMENTS

| | | | |
|---|---|---|---|
| 3,219,925 | 11/1965 | Borley et al. | 340/686.6 |
| 4,000,459 | 12/1976 | Little | 324/40 |
| 4,278,968 | 7/1981 | Arnett et al. | 340/545 |
| 4,424,458 | 1/1984 | Buck et al. | 340/686.6 |
| 4,922,235 | 5/1990 | Petitjean et al. | 340/686 |
| 5,134,350 | 7/1992 | Mahoney | 318/466 |
| 5,149,962 | 9/1992 | Maurice | 250/227.17 |
| 5,241,276 | 8/1993 | Tanaka et al. | 324/452 |
| 5,334,831 | 8/1994 | Maurice | 250/227.17 |
| 5,399,853 | 3/1995 | Maurice | 250/227.17 |
| 5,602,526 | 2/1997 | Read | 340/457 |
| 5,619,188 | 4/1997 | Ehlers | 340/686 |
| 5,633,626 | 5/1997 | Cawthorne | 340/545 |

FOREIGN PATENT DOCUMENTS 4322249  4/1994  Germany .

*Primary Examiner*—Jeffery A. Hofsass
*Assistant Examiner*—Toan Pham
*Attorney, Agent, or Firm*—Howard & Howard

[57] ABSTRACT

A sensor apparatus for the non-contact monitoring of a predetermined end position of a mechanical element, in particular a door in an aircraft, is provided which comprises a probe, an electronic measurement means, and a control means. The probe is attached to the aircraft and samples the distance between itself and a target surface on the element to be monitored. The electronic measurement means is connected to the probe and is so constructed that in response to at least one control signal it generates a measurement signal corresponding to the distance. The control means is connected to the electronic measurement means and generates the control signals, receives measurement signals and generates an indicator signal to indicate that the end position has been detected.

11 Claims, 4 Drawing Sheets

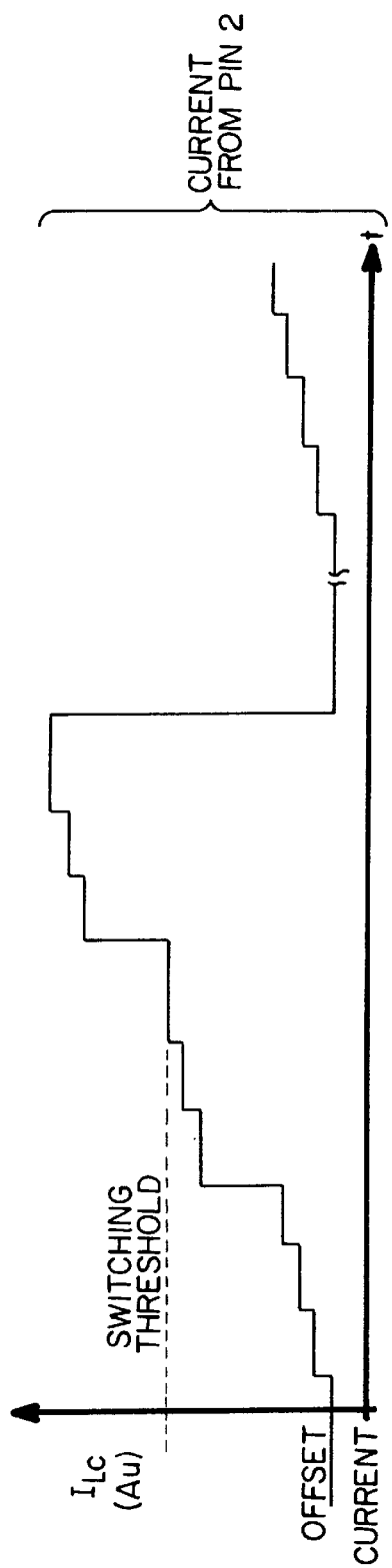
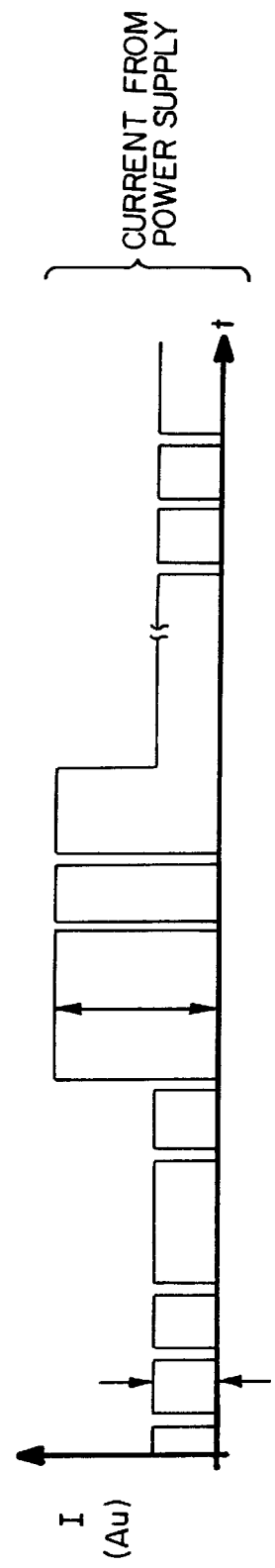

SENSOR APPARATUS

FIELD OF THE INVENTION

The present invention relates to a sensor apparatus for use in the non-contact monitoring of a predetermined end position of a mechanical element, in particular a door in an aircraft.

DESCRIPTION OF THE PRIOR ART

When the functionality of mechanical elements in aircraft is being monitored, it is essential for exact and reliable data to be available both before takeoff and during the flight. For example, it is of the utmost importance that the crew be informed about the state of closure of the doors. Especially problematic in this regard are the doors of cargo areas, which are vulnerable to malfunction because of both their size and the likelihood of rough treatment during loading and unloading. Even "normal" wear and tear, as well as permanent or slow deformation, can cause them to close imprecisely and inadequately. For this reason sensor devices are installed, and these must be repeatedly checked in the course of maintenance work.

Known sensor devices are only capable to a limited extent of detecting the state of closure of the doors, or in general the end position of any moving mechanical element, with such great reliability and accuracy as to facilitate maintenance and increase flight safety.

The object of the present invention is to provide a sensor apparatus by means of which safety in flight can be increased without elaborate construction or maintenance.

SUMMARY OF THE INVENTION

According to the present invention there is provided a sensor apparatus for the non-contact monitoring of a predetermined end position of a movable mechanical element comprising a probe operable to sample a distance between the probe and a target surface on the mechanical element; an electronic measurement means which is connected to the probe and so constructed that in response to at least one control signal it generates a measurement signal corresponding to the distance; and a control means connected to the electronic measurement means and operable to generate the control signal, to receive the measurement signal and to generate an indicator signal to indicate that the predetermined end position has been detected.

The sensor of the invention is so designed that the measurement signal is produced in response to a signal from a control means located at a distance from the measurement means and the probe. This arrangement makes it possible to check the functionality of the whole system in a simple manner.

The electronic measurement means is preferably disposed so as to form a structural unit with the probe. This spatial proximity enables interference between the probe and the measurement means to be almost completely eliminated, and allows the measurement circuitry to be made sufficiently massive so that it is not susceptible to mechanical stresses.

Preferably, the electronic measurement means and the control means are so constructed that the control signal, the measurement signal and current powering the electronic measurement means are transmitted through only two leads connected between the electronic measurement means and the control means. This arrangement further simplifies the installation and removal of the apparatus, and makes the apparatus more resistant to damage.

The measurement means is preferably so constructed that the measurement signal is generated by the electronic measurement means at a temporal interval following receipt of the at least one control signal. As a result, a plurality of measurement means with probes can be interrogated by a single control unit. It is especially preferred, for the control means to be operable to produce a group of control signals, the electronic measurement means to be so constructed that upon receipt of each control signal in the group of control signals it generates a different reference value, which is compared with a signal from the probe that depends on the distance, and when a reference value matches the signal from the probe the electronic measurement means generates the measurement signal, and for the control means to be so constructed that the indicator signal is formed by a comparison of the control signal and the measurement signal to determine temporal coincidence. This arrangement has the advantage that in the control means all the data are present that contain information about what is going on in the measurement means at any given moment. The "responses" of the measurement means are therefore easily "understood" by the control means. This arrangement is considerably less vulnerable to interference than a free-running measurement system.

Preferably, the electronic measurement means comprises a coding unit operable to generate reference values according to the received control signals, and a comparator that compares the reference values with the signals from the probe representing the distance and that generates the measurement signal when the reference value produced by the coding unit matches the signal from the probe. This arrangement makes the relation between the "interrogatory" signals and the "responses" of the measurement means particularly clear and simple. The same applies to the construction of the apparatus as a whole. In this case the apparatus preferably comprises a (binary) counter to serve as a coding mechanism, while the control means comprises a clock-pulse generator that generates the control signals as counting or clock signals for the counter. The control means further generates a reset signal that is sent out after each group of counting or clock signals comprising a number of signals that corresponds to the content of the counter that represents a maximal reference value; thus after each such group of signals, the counter is reset to an initial condition (content "0"). The reference value corresponds to the counter content—for example, it can increase as the counter content is incremented—and is generated by a D/A converter, e.g. a switchable resistance network. This embodiment is particularly simple and can easily be implemented with commercially available components. During upward counting, the measurement signal is generated whenever the rising reference value exceeds the level of the probe signal representing distance.

The control means preferably comprises a supervisory mechanism to check the functionality of the measurement means and the probe. This in turn preferably comprises a current-measuring unit to monitor the current that powers the measurement means and the probe, in particular while these are in a certain operating condition, i.e. not only in the resting condition. In particular, the function of the measurement means plus probe is regarded as disturbed when suddenly no measurement signals are produced, even though counting or clock signals are being generated.

In a preferred embodiment of the invention, the probe comprises an oscillator with a coil. The Q factor of the oscillator is altered by the spatial relation of the coil to the surface being monitored. In this arrangement, the Q factor of the oscillator can be changed as well as (where appropriate, in addition to) its resonant frequency.

The present invention will now be described by way of example with reference to the accompanying drawings.

DESCRIPTION OF A PREFERRED EMBODIMENT

Figure 1:
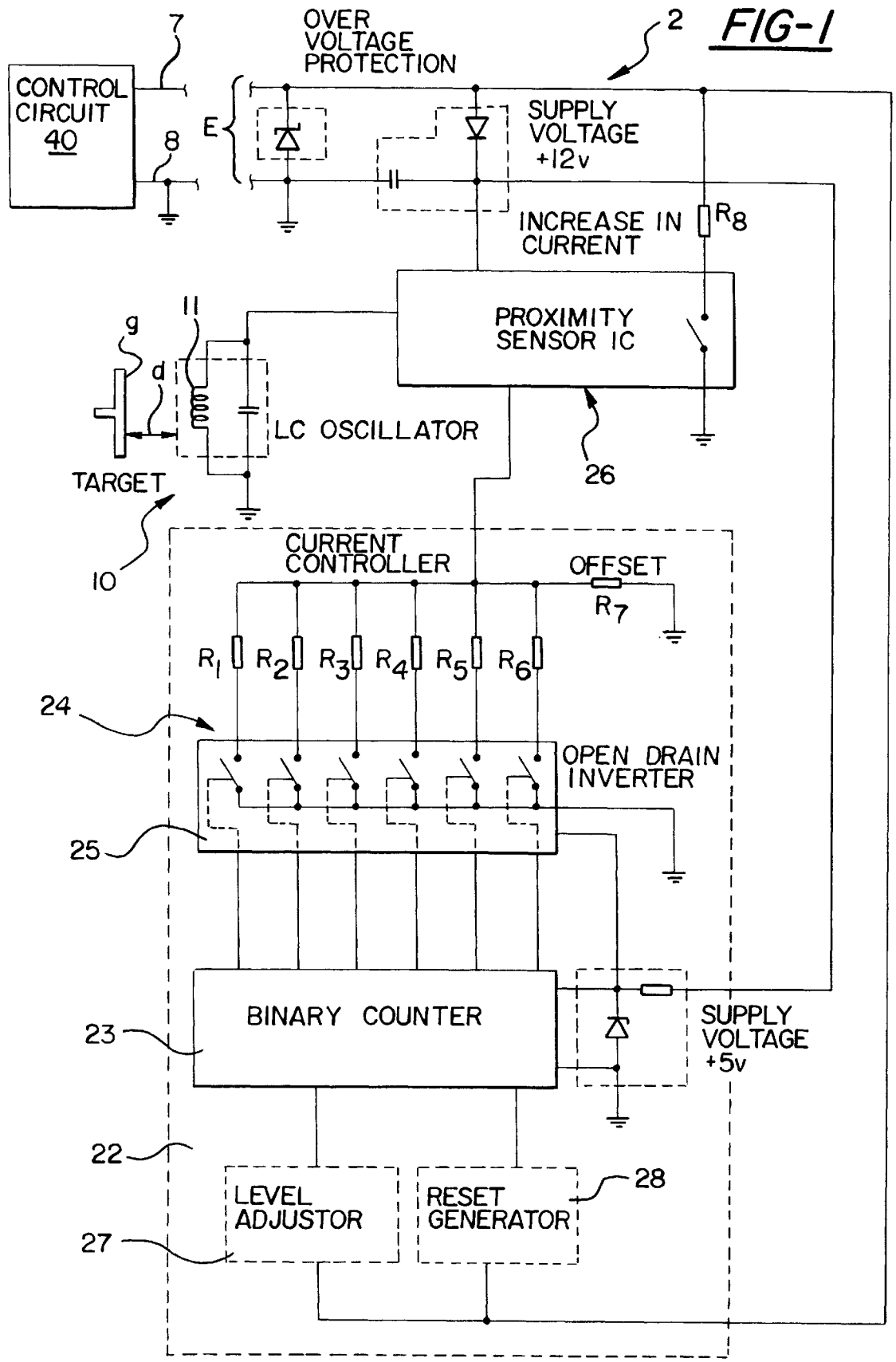
FIG. 1 is a block diagram of an embodiment of sensor apparatus according to the invention.

In the following description, the same reference numerals are used for identical components of the sensor apparatus or components with identical actions.

In FIG. 1 the reference numeral 40 indicates a control circuit, which is connected to a measurement circuit 20 by way of leads 7 and 8 (ground).

At an input E to the measurement circuit 20 is a transsorber diode, interposed between the first lead 7 and the second lead 8 to limit the voltage between the leads 7 and 8 to a level that does not endanger the components and that is substantially just above the supply voltage, which is preferably +12 V.

Figure 2:
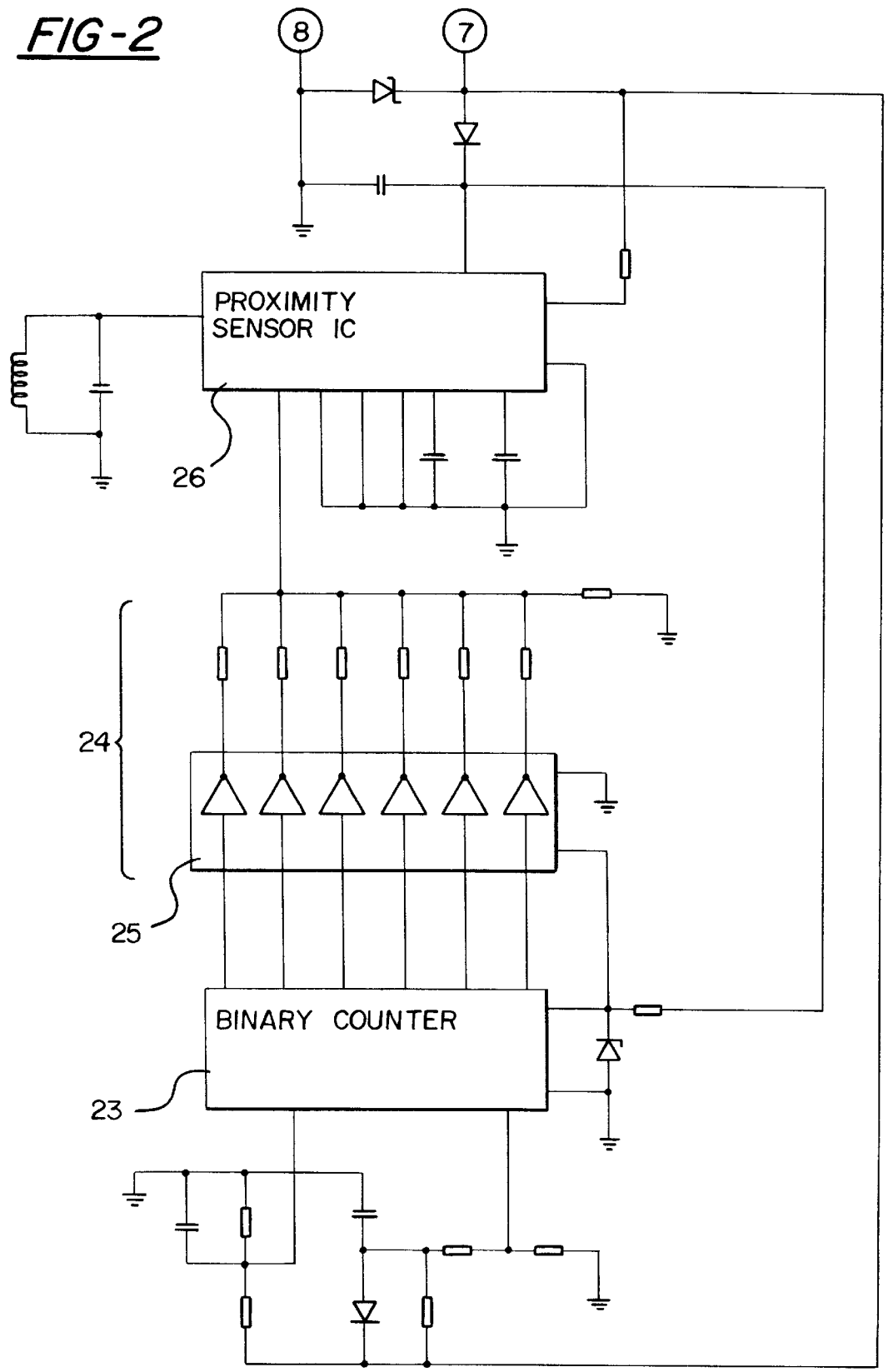
FIG. 2 is a practicable circuit diagram equivalent to the block diagram of the embodiment of the invention shown in FIG. 1.

A proximity sensor IC 26, which in the circuit diagram of FIG. 2 consists of the commercially available component TCA 505 BG, has a supply-voltage input (PIN 12 in FIG. 2) connected to the output of a rectifying circuit that comprises a diode connected in the conducting direction (D2 in FIG. 2) and a filter capacitor (C2 in FIG. 2). One output (PIN 11 in FIG. 2) is connected to the lead 7 by way of a resistor R8. One input (PIN 1 in FIG. 2) is connected to a probe 10, which comprises a coil 11 in parallel with a capacitor (C1 in FIG. 2). The LC oscillator thus formed can be changed in its Q factor, and to a small extent in its resonant frequency, by changing the distance between a target surface 9 and the coil 11. An arrangement of this kind is known per se.

The measurement circuit 20 further comprises a coding unit 22, which substantially comprises a binary counter 23 and a switchable resistance network 24, that can be understood as a D/A converter.

The binary counter 23, which is shown in FIG. 2 as component MC 14024, comprises a clock input (PIN 1 in FIG. 2) connected to the lead 7 by way of a level adjustor 27. The level adjustor 27 comprises, as shown in FIG. 2, a voltage-divider circuit consisting of resistances R 9 and R 10, which halve the voltage on the lead 7 with respect to ground. In addition, a filter capacitor C 5 is connected between clock and ground to short-circuit disturbances in the form of spike pulses.

A reset input (PIN 2 in FIG. 2) to the binary counter 23 is also connected to the lead 7, by way of a reset generator 28 as shown in FIG. 1. This reset generator 28 also comprises, as shown in FIG. 2, a voltage-divider circuit, here consisting of three resistors R 11, R 12 and R 13 in series. These three resistors R 11, R 12 and R 13 are inserted between the lead 7 and ground. Between the reset input of the binary counter 23 and ground is the resistor R 13. The resistor R 11, which is connected to the lead 7, is bridged by a diode D 2 (in the nonconducting direction). The junction of diode D2, resistor R 11 and resistor R 12 is connected to ground by way of a filter capacitor C 6. This network forms an asymmetrical low-pass filter, the time constant of which is about 30 ms for pulses of ascending polarity, which the diode D 2 blocks.

Other inputs to the binary counter 23 comprise a ground input (PIN 7 in FIG. 2) and a power-supply input (PIN 14 in FIG. 2) which are connected to the power-supply input of the proximity sensor 26 (PIN 12 in FIG. 2), by way of a Zener diode, to stabilize the supply voltage, and a resistor (R 14 in FIG. 2).

The binary counter 23 has 6 outputs (Q1=LSB; Q6=MSB in FIG. 2)); these are connected to a switch component 29, which in FIG. 2 is shown as a component of the type 74 HC 05. Power is supplied to the switch component 29 by a connection to the power-supply line of the binary counter 23. The outputs of the binary counter 23 control the states of the switches in the switch component 29, such that outputs (PINs 2, 4, 6, 8, 10 and 12 in FIG. 2) of the switch component 29 are either grounded or kept open, depending on the signals from the binary counter 23. More particularly, a constant voltage output is switched sequentially from each of pins, 2, 4, 6, 8, 10 and 12 to the next as the binary counter 23 is incremented, as more fully explained below.

The outputs of the switch component 29 are connected, by way of resistors R 1 to R 6, to a comparator input (PIN 2 in FIG. 2) of the proximity sensor 26, which is also connected to ground by way of an additional resistor R 7. In this arrangement, the resistors R 1 to R 7 form a resistance network that can be switched by the switch component 29. The current level at pin 2 of the proximity sensor 26 thus varies as the binary counter 23 is incremented.

One output (PIN 11 in FIG. 2) of the proximity sensor IC, which operates as a comparator circuit 26, is connected to the lead 7 by way of a resistor R 8.

The comparator circuit 26 is so constructed that the Q factor of the LC oscillator constituting the probe 10 is used to produce a signal corresponding to the distance d between the coil 11 and the target surface 9; this signal is compared with a reference signal corresponding to a current flowing to ground through the resistance network 24, i.e. the resistors R1–R7 and the switch component 29. Whenever the probe signal and the reference signal match, a switch is closed that grounds the resistor R 8, so that more current flows through the lead 7 from the control circuit 40.

The operation of the embodiment of the sensor apparatus of the invention will now be described in more detail with reference to FIG. 3.

Figure 3A:
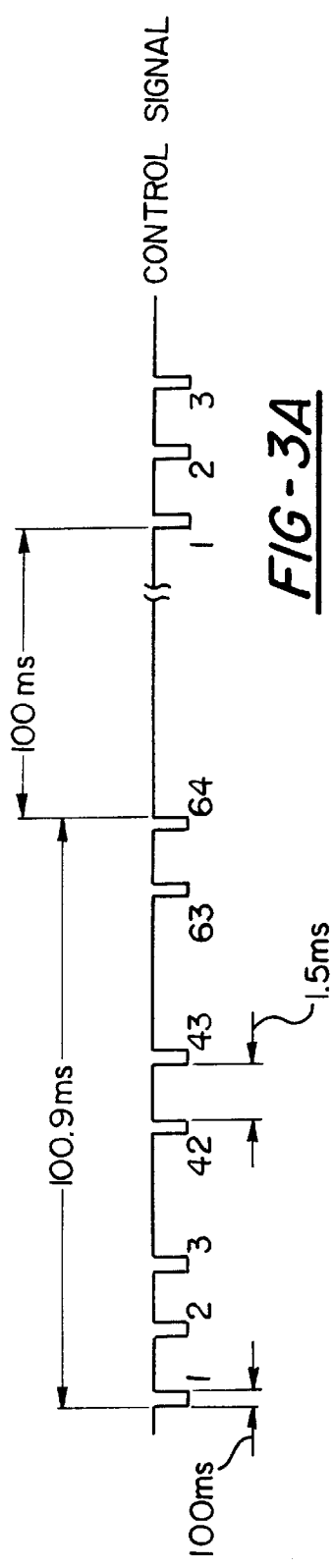
FIG. 3 is a time diagram to explain switching states of individual elements of the apparatus shown in FIGS. 1 and 2.
Figure 3B:
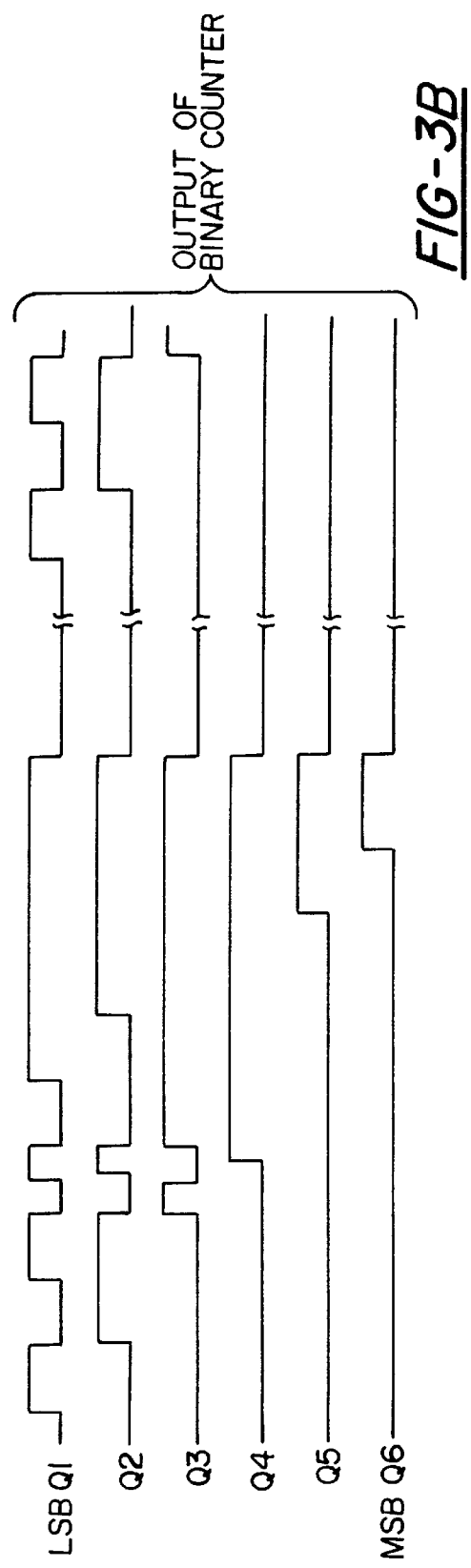

The top diagram a.) of FIG. 3 shows (in isolation) the time course of a control signal that is imposed on the control voltage on lead 7, by appropriate circuitry within the control circuit 40.

Diagram b.) shows the states of the switches at the output of the counter 23.

The reference value at the comparator circuit 26 is shown in diagram c.) of FIG. 3 as a current; here the "switching threshold" indicates the reference value that matches the signal from the probe 10.

In diagram d.) of FIG. 3 is shown schematically the variation in time of the amount of current flowing through lead 7.

At time $t_0$ a clock-pulse generator in the control circuit 40 begins to produce pulses with a duration of about 100 µs, which for a brief period greatly reduce the current produced by the control circuit 40. Whenever one of these clock pulses arrives at the clock input of the counter 23, the content of the counter is incremented, which in turn increases the current entering the comparator circuit 26 from its PIN 2. This process is shown in FIG. 3 up to the thirteenth pulse, at which time—according to the assumptions in this example—the reference value (at PIN 2 of the comparator circuit 26) exceeds the level of the signal from the probe 10 (i.e., the "switching threshold" in FIG. 3c).

As soon as this reference value has been reached or exceeded, the resistor R 8 is grounded, so that the current flowing through lead 7 is no longer at the power-supply level (labelled $I_0$ in FIG. 3) but is increased to the level $I_s$, which preferably is about 2.5 times the "normal" power-supply level $I_0$. This increase to $I_s$ can be detected in the control circuit 40. The fact that the increase in current, which serves as a measurement signal, coincides with the thirteenth clock pulse, which acts as a control signal, is utilized in the control circuit 40 to generate an indicator signal that represents the distance d between the probe 10 and the target surface 9. The control circuit 40 thus includes a current sensor (not shown) and a pulse counter (not shown) which responds to the increased current to generate the indicator signal which is indicative of the distance the target surface 9 is from the probe 10.

The measurement signal (the elevated current $I_s$) now flows not only until the 64th control signal (clock pulse) has filled the counter 23 to capacity, but for a certain additional time determined by the time constant of the reset generator 28. That is, after the 64th clock pulse (in the case of larger counters 23, correspondingly more clock pulses) the control circuit 40 sends out no more clock pulses for a period lasting about 100 ms. The time constant (30 ms) of the reset generator 28 is made such that after this period of time, about 30 ms, has elapsed the voltage at the reset input (PIN 2 in FIG. 2) of the counter 23 has risen to an effective level, sufficient to reset the counter 23. The time at which this occurs is indicated in FIG. 3 by RESET.

After the pause, which in the present example is 100 ms, has ended, the control circuit 40 again begins to emit control signals, so that the counting and measurement processes start over.

The control circuit 40 is further so constructed that from the change in the level of the power-supply current I (as shown in part d of FIG. 3), information about the functionality or a malfunction of the measurement circuit with its probe can be derived.

It will be evident from the above that with the embodiment of the invention disclosed here, it is possible to determine not only whether the distance d between the probe 10 and the target surface 9 is small enough that complete closure of the door which bears the target surface 9 can be inferred, but also how large the distance actually is. This in turn makes it possible, during maintenance procedures, to obtain information about the state of the door's closing and suspension mechanisms. The system is extremely easy to calibrate even before it has been installed in an aircraft, so that the measurement system itself can be used to assist installation of the target surface 9 and determine its basic position with respect to the probe 10. As all signals flow through only two leads, between the control unit 40 and the measurement circuit 20, the system is extremely simple to install and resistant to interference. The electronics incorporated in the measurement circuit 20 are passive, so to speak, operating exclusively in response to the control signals emitted by the control circuit 40. As a result, the apparatus is even less vulnerable to interference. A further consequence is that precalibrated measurement circuits incorporating a probe can be manufactured, which makes it considerably easier to exchange the circuits. There is no need to adapt the measurement circuit with probe and the control circuit to one another. By incorporating means for switching (not shown) the single control unit from first one probe to another, a plurality of probes can be interrogated by the single control unit.

What is claimed is:

1. Sensor apparatus for the non-contact monitoring of a predetermined end position of a movable mechanical element comprising:
    a probe operable to sample a distance between the probe and a target surface on the mechanical element;
    an electronic measurement means which is connected to the probe and so constructed that in response to at least one control signal it generates a measurement signal corresponding to the distance; and
    a control means connected to the electronic measurement means operable to generate the control signal, to receive the measurement signal and to generate an indicator signal to indicate that the predetermined end position has been detected,
wherein the electronic measurement means is so constructed that the measurement signal is generated by the electronic measurement means at a time interval following receipt of the at least one control signal.

2. Sensor apparatus as claimed in claim 1, wherein the electronic measurement means and the control means are so constructed that the control signal, the measurement signal and current powering the electronic measurement means are transmitted through a single lead connected between the electronic measurement means and the control circuit.

3. Sensor apparatus as claimed in claim 2, wherein the electronic measurement means is disposed so as to form a structural unit with the probe.

4. Sensor apparatus as claimed in claim 2, wherein the electronic measurement means comprises a coding unit operable to generate reference values according to the received control signals, and a comparator that compares the reference values with the signals from the probe representing the distance and that generates the measurement signal when the reference value produced by the coding unit matches the signal from the probe.

5. Sensor apparatus as claimed in claim 2, wherein the control means comprises a supervisory means comprising a current-measuring device to monitor current powering the electronic measurement means and the probe thereby to check the functionality of the electronic measurement means and the probe.

6. Sensor apparatus as claimed in claim 2, wherein the probe comprises an oscillator with a coil, the Q factor of the oscillator being dependent on the spatial relationship between the coil and the target surface.

7. Sensor apparatus as claimed in claim 1, wherein the control means is operable to produce a group of control signals, the electronic measurement means is so constructed that upon receipt of each control signal in the group of control signals it generates a different reference value, which is compared with a signal from the probe that depends on the distance, and when a reference value matches the signal from the probe the electronic measurement means generates the measurement signal, and wherein the control means is so constructed that the indicator signal is formed by a comparison of the control signal and the measurement signal to determine temporal coincidence.

8. Sensor apparatus as claimed in claim 1, wherein the electronic measurement means comprises a coding unit operable to generate reference values according to the received control signals, and a comparator that compares the reference values with the signals from the probe representing the distance and that generates the measurement signal when the reference value produced by the coding unit matches the signal from the probe.

9. Sensor apparatus as claimed in claim 1, wherein the control means comprises a supervisory means comprising a current-measuring device to monitor current powering the electronic measurement means and the probe thereby to check the functionality of the electronic measurement means and the probes.

10. Sensor apparatus as claimed in claim 1, wherein the probe comprises an oscillator with a coil, the Q factor of the oscillator being dependent on the spatial relationship between the coil and the target surface.

11. Sensor apparatus as claimed in claim 1, wherein the electronic measurement means is so disposed so as to form a structural unit with the probe.

* * * * *